United States Patent

Wagner et al.

(10) Patent No.: US 6,868,530 B2
(45) Date of Patent: Mar. 15, 2005

(54) METHOD FOR FABRICATING AN INTEGRATED SEMICONDUCTOR CIRCUIT

(75) Inventors: Michael Wagner, Oberschweinbach (DE); Klaus Keiner, Höhenkirchen (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/310,397

(22) Filed: Dec. 5, 2002

(65) Prior Publication Data

US 2003/0106026 A1 Jun. 5, 2003

(30) Foreign Application Priority Data

Dec. 5, 2001 (DE) .......................................... 101 59 699

(51) Int. Cl.[7] .............................................. G06F 17/50
(52) U.S. Cl. .......................................................... 716/1
(58) Field of Search .................... 716/1–21; 438/128; 257/202; 700/121

(56) References Cited

U.S. PATENT DOCUMENTS

| | | | | | |
|---|---|---|---|---|---|
| 4,964,057 A | * | 10/1990 | Yabe | ............................... | 716/9 |
| 5,420,800 A | * | 5/1995 | Fukui | ............................ | 716/10 |
| 5,666,288 A | * | 9/1997 | Jones et al. | ..................... | 716/17 |
| 5,737,236 A | * | 4/1998 | Maziasz et al. | ................. | 716/8 |
| 5,764,533 A | * | 6/1998 | deDood | ........................... | 716/8 |
| 5,824,570 A | * | 10/1998 | Aoki et al. | ................... | 438/128 |
| 5,841,157 A | * | 11/1998 | Kojima et al. | ............... | 257/202 |
| 5,847,969 A | * | 12/1998 | Miller et al. | ................... | 716/17 |
| 5,920,486 A | * | 7/1999 | Beahm et al. | ................. | 716/10 |
| 6,031,982 A | * | 2/2000 | Truong et al. | ................. | 716/16 |
| 6,070,108 A | * | 5/2000 | Andreev et al. | ............. | 700/121 |
| 6,324,671 B1 | * | 11/2001 | Ratzel et al. | ................... | 716/1 |
| 6,340,825 B1 | * | 1/2002 | Shibata et al. | .............. | 257/207 |
| 6,385,761 B1 | * | 5/2002 | Breid | ............................. | 716/8 |
| 6,401,232 B1 | * | 6/2002 | Iadonato et al. | .............. | 716/10 |
| 6,536,028 B1 | * | 3/2003 | Katsioulas et al. | ............ | 716/17 |
| 6,643,835 B2 | * | 11/2003 | Matsumoto et al. | ........... | 716/11 |
| 6,735,742 B2 | * | 5/2004 | Hatsch et al. | ................... | 716/2 |
| 2002/0007478 A1 | * | 1/2002 | Tien | ............................... | 716/2 |
| 2002/0069396 A1 | * | 6/2002 | Bhattacharya et al. | ......... | 716/7 |
| 2002/0087939 A1 | * | 7/2002 | Greidinger et al. | ............ | 716/2 |

FOREIGN PATENT DOCUMENTS

JP      07 086 412 A      3/1995

* cited by examiner

*Primary Examiner*—Vuthe Siek
*Assistant Examiner*—Magid Y. Dimyan
(74) *Attorney, Agent, or Firm*—Laurence A. Greenberg; Werner H. Stemer; Gregory L. Mayback

(57) ABSTRACT

A method for fabricating a semiconductor circuit uses a computer program to compute a circuit diagram that is made up of a large number of surface cells, each having a uniform height. Space-saving layouts require a uniform cell height for all the surface cells. The height is conventionally prescribed by a computer file containing standardized dimensions for a large number of surface cells. Accordingly, such surface cells as are required for a specific semiconductor circuit that is to be fabricated are selected, and the selection is used to compute a circuit-specific uniform cell height. The height is less than the height prescribed by the computer file and results in surface area being saved on the semiconductor chip.

8 Claims, 3 Drawing Sheets

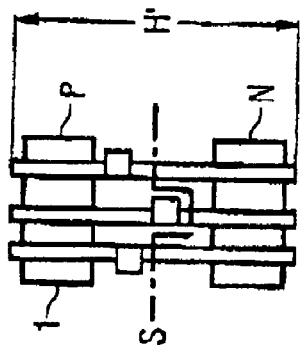
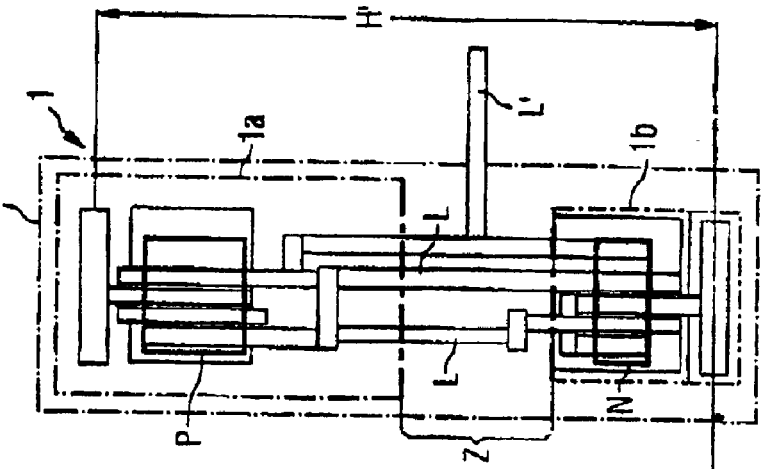
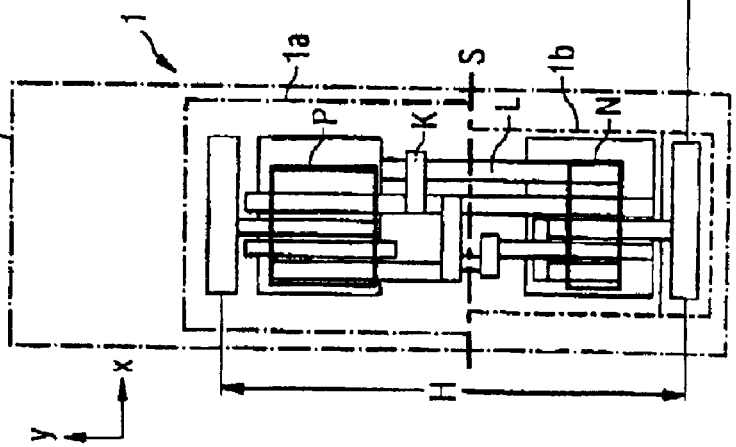

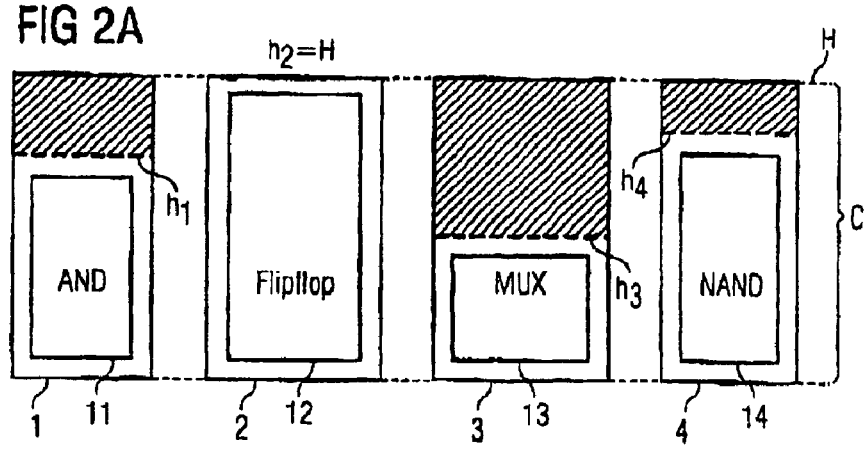
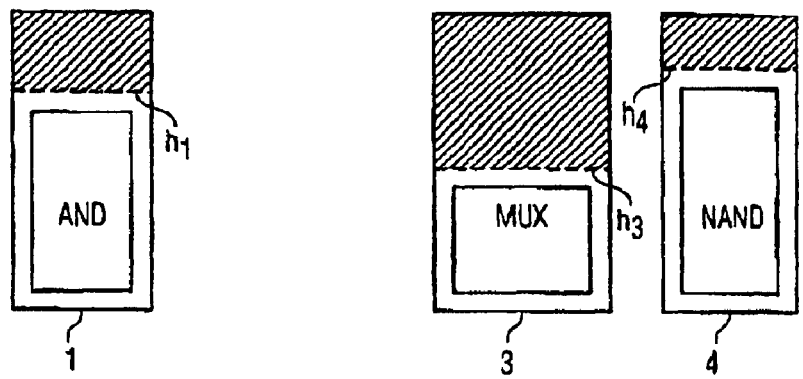
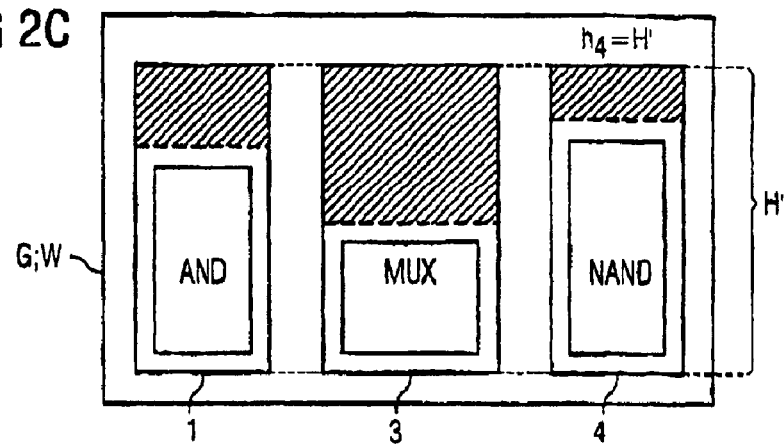

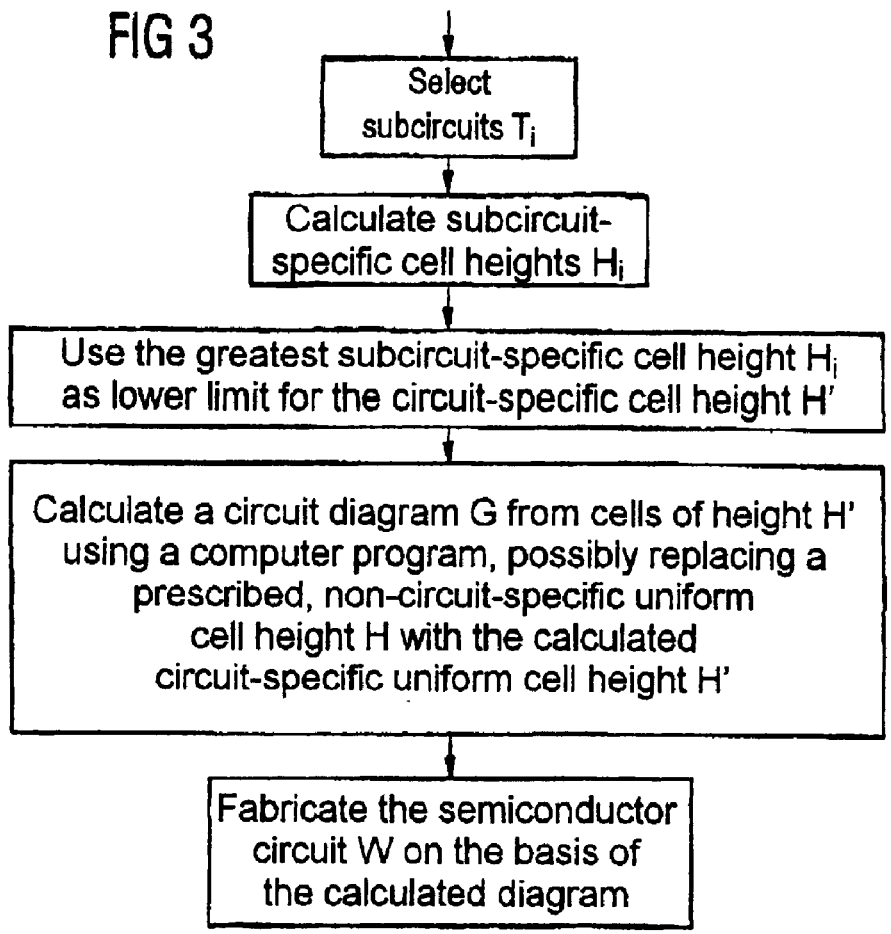
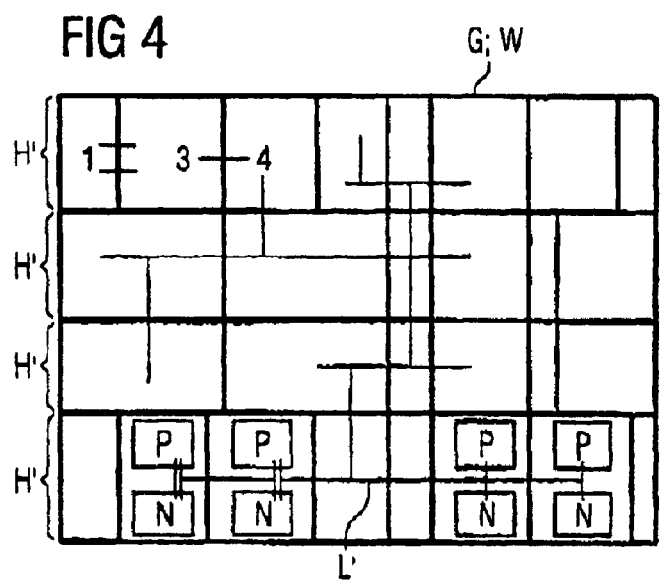

METHOD FOR FABRICATING AN INTEGRATED SEMICONDUCTOR CIRCUIT

BACKGROUND OF THE INVENTION

Field of the Invention

The invention relates to a method for fabricating an integrated semiconductor circuit, in which a computer program is used to compute a circuit diagram, and a semiconductor circuit is fabricated on the basis of the circuit diagram. The circuit diagram is computed by: defining surface cells for different subcircuits in the semiconductor circuit, stipulating a uniform cell height for the surface cells, disposing the surface cells in one plane, and computing interconnect paths between the surface cells.

Such fabrication methods use "Place-and-Route" software programs which allow surface cells of different width, but of uniform height, to be disposed in a diagram corresponding to the surface of an integrated circuit which is to be fabricated, and to be connected to one another by interconnects, vias, etc. The uniform height of all the surface cells to be disposed is necessary for geometric reasons in order to be able to dispose surface cells of varying size in a space-saving manner without leaving unused interspaces between the surface cells remaining. Current computer programs make use of software libraries of standard cell sizes in which the electrical properties and the geometric dimensions of the standard cell and within the standard cell are prescribed for various microelectronic subcircuits, such as multiplexers, logic gates or flip-flops. All standardized surface cells in the software library have a uniform cell height.

Most of the subcircuits could also be accommodated in cells of a lesser height, but the uniform standard height is necessary for reasons of geometric arrangement. The standard height is prescribed by the largest subcircuits in a standard cell library. If a specific semiconductor circuit is to be planned, a computer program and the standard cell library can be used to compute the layout of the semiconductor circuit that is to be fabricated.

In contrast to this computer-aided manner of fabrication, a circuit layout can also be determined entirely by a layout that is manually optimized for each subcircuit or for each individual component. This results in surface area being saved on the semiconductor chip, albeit with serious cost drawbacks. Since the cost drawbacks usually predominate, use is made of the first technical method cited above, i.e. computer-aided design. The loss of surface area as compared with the manually optimized layout is more than compensated for as a result of the cost advantages of automatic layout calculation.

SUMMARY OF THE INVENTION

It is accordingly an object of the invention to provide a method for fabricating an integrated semiconductor circuit that overcomes the above-mentioned disadvantages of the prior art methods of this general type, which allows inexpensive and, at the same time, space-saving configuration of components on a semiconductor substrate. The semiconductor circuit is intended to be able to be planned and fabricated more quickly and less expensively than previously.

With the foregoing and other objects in view there is provided, in accordance with the invention, a method for fabricating an integrated semiconductor circuit. The method uses a computer program to define a circuit diagram by the steps of: defining surface cells for different subcircuits in the integrated semiconductor circuit, stipulating a uniform cell height for the surface cells, and stipulating a circuit-specific uniform cell height by selecting from a set of the subcircuits having the surface cells for which the uniform cell height has been determined, the subcircuits needed for constructing the integrated semiconductor circuit and defining a least possible cell height of adequate size for all of the subcircuits selected as the circuit-specific uniform cell height for the surface cells in all the subcircuits selected. The surface cells selected are disposed in one plane. Interconnect paths between the surface cells selected are computed, and the circuit diagram is computed from the surface cells selected and having the circuit-specific cell height. The integrated semiconductor circuit is fabricated on a basis of the circuit diagram.

The invention achieves the object in that a circuit-specific uniform cell height is stipulated by selecting from a set of subcircuits, for whose surface cells a uniform cell height has been prescribed, those subcircuits from which the semiconductor circuit is constructed and by defining the least possible cell height which is of adequate size for each of the selected subcircuits as the circuit-specific uniform cell height for the surface cells in all the selected subcircuits, and in that a circuit diagram is computed from surface cells which have the circuit-specific cell height, and the semiconductor circuit is fabricated on the basis of the circuit diagram.

The invention takes a central route between purely manually optimized and computer-optimized layout design. Computer programs and standard cell libraries continue to be used in order to produce a cost-saving layout. However, the standard cell library, particularly the standard cell height it prescribes, is not adopted for calculating a circuit diagram, but rather circuit-specific height optimization is performed instead. According to the invention, only those subcircuits that are needed for the circuit that is to be fabricated are used for calculating the least possible standard height for all of these subcircuits. This makes it possible to calculate standard cells that have a lesser uniform height than the height prescribed by the standard cell library. With the smaller standard cells, the size of which is respectively dependent on the specific overall circuit, i.e. on the combination of all the subcircuits this circuit contains, the Place-and-Route program can then be used in a manner which is conventional per se in order to compute the layout. The least possible uniform height is stipulated for the subcircuits selected for the circuit. The precise value of the uniform height is ideally the smallest possible value, but can also be larger depending on allowances for wiring resources for the Place-and-Route software program.

On the basis of the standard cell sizes, which are smaller in accordance with the invention, the inventive fabrication is not just cost-saving but is also associated with a saving of surface area on the semiconductor chip.

In one preferred embodiment, for each subcircuit used to construct the semiconductor circuit, the least possible subcircuit-specific cell height is first computed individually and from this the greatest subcircuit-specific cell height is defined as the lower limit for the uniform cell height for all the surface cells. This involves, not only the largest subcircuits in the overall circuit to be fabricated being included in the height calculation, but also the smaller subcircuits being individually optimized. This can be beneficial, since each individual standard cell, as will be described below, always has a p-well and an n-well into which appropriate transistors are inserted. Optimization of each subcircuit individually results in a space-saving subcircuit-specific surface layout that can later be expanded to a uniform height by a simple height extension.

If the subcircuit-specific minimum heights of the cells are determined for all the subcircuits that are to be used, then the greatest among them is selected and is defined as the uniform standard height of all the cells in the overall circuit that is to be fabricated.

Preferably, a prescribed uniform cell height, prescribed by a computer file for a multiplicity of surface cells, is replaced by a lesser, circuit-specific uniform cell height.

In one preferred embodiment, for each subcircuit which is to be disposed in a surface cell, a respective first doped well and a second well, having the opposite doping to the first well, are defined in the circuit diagram, and the first well and the second well in each surface cell are distanced from one another until the surface cell reaches a height which corresponds to the uniform cell height. To this end, in particular, a line of intersection is defined between an n-well and a p-well in a surface cell in the circuit diagram, from which line of intersection the p-well is shifted in the direction of increasing cell height. Similarly, the n-well (or else both wells around a subsection) can be removed from the line of intersection in the corresponding surface cell to which these wells belong. In this way, all smaller surface cells are stretched in height until they reach the circuit-specific uniform cell height.

Preferably, interspaces arising as a result of the shifting of the p-wells are bridged in the circuit diagram by lengthened interconnects within the surface cells. These interconnects can also be taken into account during computer-optimized interconnect design.

Preferably, the subcircuits provided in the surface cells are logic gates, flip-flops and/or multiplexers. This listing is merely exemplary; the type and size of the subcircuits required are respectively geared to the overall circuit that is to be fabricated. The size differences between different subcircuits that can be given a uniform standard cell height can be several standard squares. The height of a surface cell is always an integer multiple of a standard square. A standard square is prescribed by the relative positions of adjacent interconnects with respect to one another and is 300 to 800 nm, for example. The subcircuits disposed using the present invention preferably each have between 2 and 50 components. At this size, a subcircuit extends over a height of 10 to 14 standard squares. Using the present invention, the uniform surface cell height used for the semiconductor circuit that is to be fabricated can be reduced by 4 to 5 standard squares.

Preferably, no more than 50 to 150 different subcircuits for which a circuit-specific uniform cell height is stipulated are selected. In contrast to this, standard cell libraries contain approximately 300 different subcircuits of uniform cell size. Despite the ever remaining diversity of, by way of example, 100 different cell types, the selection can result in a noticeable saving of surface area.

Finally, the semiconductor circuit based on a diagram is fabricated from no more than 1000 surface cells. Particularly with a small selection of different subcircuits for fabricating the overall circuit, a considerable amount of surface area can frequently be saved.

Particularly when there are a small number of subcircuits that need to be integrated in an overall circuit, there is a high likelihood of a limited selection of different subcircuits being sufficient to produce the overall circuit. In this case, the amount of chip area saved is particularly large. In comparison with manually optimized layout designs, the inventive method results in a significant cost advantage, and results in a surface area saving as compared with a conventional automated layout design which is nonetheless supported by a standard cell library with a uniformly prescribed cell height. The invention is particularly suitable for logic circuits using CMOS technology (Complementary Metal Oxide Semiconductor), which have an n-well and a p-well, respectively, in each surface cell.

Other features which are considered as characteristic for the invention are set forth in the appended claims.

Although the invention is illustrated and described herein as embodied in a method for fabricating an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A to 1C are illustrations of a layout design for individual surface cells;

FIGS. 2A to 2C are illustrations showing a height optimization process according to the invention;

FIG. 3 is a flowchart for describing a method according to the invention; and

FIG. 4 is an illustration of diagram for a semiconductor circuit according to the invention.

DESCRIPTION OF THE PREFERRED EMBODIMENTS

Referring now to the figures of the drawing in detail and first, particularly, to FIG. 1A thereof, there is shown a subcircuit 1 which has a p-well P in a top subregion 1a and an n-well N in a bottom subregion 1b. The wells have semiconductor transistors disposed in them, for example. Interconnects L and contact connections K connect the transistors or other active components disposed in the wells P, N to one another and to further components outside the cell 1 which is shown. The cell 1 shown has a height H that reflects a minimum dimension of the cell in one direction. A width of the cell, extending at right angles thereto in the x direction, can be of varying size. In terms of its height, i.e. in a y direction, all the surface cells need to be matched to one another.

The matching is shown in FIG. 1B. The height of the cell 1 shown has been stretched with reference to a line of intersection S shown in FIG. 1A having been taken as the starting point for shifting the top part 1a of the subcircuit, which contains the p-well P, upward until a cell height H' corresponds to a circuit-specific uniform height which is yet to be described. The interconnects between the subregions 1a and 1b of the surface cell 1 have been stretched by the shift in height.

As FIG. 1C shows, the line of intersection S between the subregions P and N can also be of any desired shape, particularly meandrous, i.e. in subsections which run at right angles to one another and circumvent contact connections or other connecting elements.

The inventive selection of subcircuits and the ensuing calculation of a circuit-specific uniform height are shown in FIGS. 2A to 2C. FIG. 2A shows four subcircuits 1, 2, 3, 4 of differing width but of uniform height H, which is prescribed by the height of a flip-flop $h_2$, for example. The rest of the subcircuits 1, 3 and 4 would require lesser heights, but their surface cells are stored with the same height H as that of the subcircuit 2 in the standard cell library for the purpose of computer-aided layout design. The height H is prescribed by the computer file that stores the subcircuits with their cell dimensions and internal dimensions.

FIG. 2B shows, by way of example, a selection of three subcircuits 1, 3 and 4 that are needed for a specific circuit. These are, by way of example, an AND gate, a NAND gate and a multiplexer MUX. The dashed lines denoted by $h_1$, $h_3$ and $h_4$ indicate approximately what minimum height the corresponding subcircuit 1, 3, 4 roughly needs to have. The height is not known from the computer file with the standard cell sizes. As can be taken from the approximate height profile shown in FIG. 2B, however, the use of surface area on the semiconductor chip is not optimum, since the hatched surface regions are actually not required.

The invention determines a new uniform cell height which can be computed, by way of example, on the basis of the gates 1, 3 and 4 shown in FIG. 2B. Provided that the height required for the multiplexer 3 is foreseeably less than that of the rest of the subcircuits, the greater of the minimum heights for the subcircuits 1 and 4 can be used as a circuit-specific uniform cell height. In line with one preferred embodiment of the invention, the subcircuit-specific minimum height $h_1$, $h_3$ and $h_4$ is computed for every selected subcircuit 1, 3, 4 in a first step. The greatest subcircuit-specific minimum height, in this case the height $h_4$, is then stipulated as a circuit-specific cell height H' which is uniform for all the surface cells 1, 3, 4 in the circuit to be fabricated.

A diagram G containing an overall circuit with one of each of the subcircuits 1, 3 and 4 is shown in FIG. 2C. The number, dimension and, in particular, the size ratios of the subcircuits 1, 2, 3 and 4 already depicted in FIGS. 2A and 2B relative to one another are not to scale and are merely examples. However, it can be seen that the lesser uniform cell height H', which now corresponds to the cell height $h_4$ and is significantly less than the cell height H prescribed using a conventional method, results in a saving of substrate surface area. Although the hatched surface regions of the subcircuits 1 and 2 are not used in this case either, the unused surface area is less than in the case of the layout from FIG. 2A, which is calculated on the basis of a conventional method.

The inventive method is shown in FIG. 3 in the form of a flowchart. Following the selection of the subcircuits $T_i$ that are needed for the circuit that is to be fabricated, subcircuit-specific cell heights $H_i$ are calculated. The optimization needed for this in the region of individual subcircuits can be performed using a further computer program or else manually. Similarly, it is also possible optionally for only the largest or probably largest required subcircuits to be subjected to such a height calculation, since smaller subcircuits generally do not require any relatively great cell heights. However, the respective minimum height is also dependent on the chosen width of a surface cell.

Of the ascertained subcircuit-specific cell heights $H_i$, the greatest is selected as the uniform cell height H' which is fixed for all the surface cells which are to be disposed. Provided that they do not already have the height H', the height of all the surface cells is stretched, to which end suitable shapes of lines of intersection are produced and cell halves are shifted. In this way, surface cells for different subcircuits are formed which all have the cell height H'. To dispose and link the surface cells formed in this manner, it is possible to use a conventional Place-and-Route program. In this case, however, the uniform height H prescribed by the software library for circuit-independent standard cell sizes is replaced by the computed circuit-specific uniform height H'.

Next, the semiconductor circuit is fabricated in accordance with the diagram thus obtained, with the surface area saving meaning that more circuits than normal can be produced on the same chip area.

FIG. 4 shows a circuit diagram G for a semiconductor circuit W which, as depicted, is made up of surface cells 1, 3, 4, etc. which all have the same cell height H', and are connected to one another by interconnects L'. The common circuit-specific cell height H' is equal to the cell height $H_4$ in this case, but can also be greater than $H_4$, for example if wiring resources need to be provided in order to accommodate the necessary interconnects on the semiconductor circuit which is to be fabricated. The configuration of a single cell containing a first n-well N and a second p-well P is shown in the very bottom row.

The surface cells are disposed in a plurality of rows each having the height H'. The cell widths can be altered over wide ranges without giving rise to unused surface areas, since the cell height is uniform. The inventive stipulation of the uniform cell height by selecting a subset of subcircuits or surface cells whose cell heights are optimized results in considerably less surface area use.

We claim:

1. A method for fabricating an integrated semiconductor circuit, which comprises the steps of:
   using a computer program to define a circuit diagram by the steps of;
   defining surface cells for different subcircuits in the integrated semiconductor circuit;
   stipulating a circuit-specific uniform cell height by selecting from a set of the subcircuits having the surface cells for which a uniform cell height has been determined, the subcircuits needed for constructing the integrated semiconductor circuit and defining a least possible cell height of adequate size for all of the subcircuits selected as the circuit-specific uniform cell height for the surface cells in all the subcircuits selected;
   disposing the surface cells selected in one plane;
   computing interconnect paths between the surface cells selected; and
   computing the circuit diagram from the surface cells selected and having the circuit-specific cell height;
   fabricating the integrated semiconductor circuit on a basis of the circuit diagram;
   defining a first doped well and a second doped well having an opposite doping to the first doped well in the circuit diagram for each of the subcircuits disposed in a surface cell, the first doped well and the second doped well in each of the surface cells being distanced from one another until the surface cells reach a height corresponding to the circuit-specific uniform cell height; and
   defining a line of intersection defined between the first doped well and the second doped well in a subcircuit in the circuit diagram, and from the line of intersection the second doped well being shifted in a direction of increasing cell height.

2. The method according to claim 1, which comprises computing for each of the subcircuits selected to construct the integrated semiconductor circuit, the least possible subcircuit-specific cell height individually and defining a greatest subcircuit-specific cell height as a lower limit for the circuit-specific uniform cell height for all the surface cells selected.

3. The method according to claim 1, which comprises replacing the uniform cell height stipulated by a computer file for the surface cells by the circuit-specific uniform cell height having a lesser dimension.

4. The method according to claim 1, which further comprises bridging interspaces arising as a result of the shifting of the p-wells in the circuit diagram by lengthening interconnects within the surface cells.

5. The method according to claim 1, which further comprises forming the subcircuits provided in the surface cells as at least one component selected from the group consisting of logic gates, flip-flops and multiplexers.

6. The method according to claim 1, which further comprises selecting no more than 50 to 150 of the subcircuits for which the circuit-specific uniform cell height is stipulated.

7. The method according to claim 1, which further comprises fabricating the integrated semiconductor circuit based on the circuit diagram from no more than 1000 of the surface cells.

8. The method according to claim 1, which further comprises fabricating the integrated semiconductor circuit as a logic circuit.

* * * * *